United States Patent
Yeh

(10) Patent No.: US 7,579,863 B2
(45) Date of Patent: Aug. 25, 2009

(54) CIRCUIT AND METHOD FOR REDUCING PIN COUNT OF CHIP

(75) Inventor: Ming-Yuh Yeh, Taipei (TW)

(73) Assignee: Realtek Semiconductor Corp., HsinChu (TW)

(*) Notice: Subject to any disclaimer, the term of this patent is extended or adjusted under 35 U.S.C. 154(b) by 0 days.

(21) Appl. No.: 12/025,687

(22) Filed: Feb. 4, 2008

(65) Prior Publication Data

US 2008/0186074 A1    Aug. 7, 2008

(30) Foreign Application Priority Data

Feb. 6, 2007    (TW) .............................. 96104191 A

(51) Int. Cl.
*G06F 7/38* (2006.01)
*H03K 19/173* (2006.01)

(52) U.S. Cl. .............................. 326/38; 326/37; 326/41

(58) Field of Classification Search ............. 326/37–41, 326/47

See application file for complete search history.

(56) References Cited

U.S. PATENT DOCUMENTS

| 5,597,442 | A | * | 1/1997 | Chen et al. ..................... 438/8 |
| 5,686,844 | A | * | 11/1997 | Hull et al. ..................... 326/38 |
| 5,862,365 | A | | 1/1999 | Modo |
| 6,831,479 | B2 | | 12/2004 | Lo |
| 2003/0188202 | A1 | | 10/2003 | D'Angelo |

FOREIGN PATENT DOCUMENTS

| CN | 1378134 A | 11/2002 |
| CN | 1799198 A | 7/2006 |
| TW | 200633381 | 9/2006 |
| WO | 2004/109927 A1 | 12/2004 |

* cited by examiner

*Primary Examiner*—Anh Q Tran
(74) *Attorney, Agent, or Firm*—Winston Hsu

(57) ABSTRACT

A configured setting circuit and method thereof is disclosed. The configured setting circuit includes a multi-phase clock generator, a plurality of terminals, and a decision circuit. The multi-phase clock generator generates a plurality of multi-phase signals with different phases to be outputted via the terminals. The decision circuit detects a phase difference between the input signal and the reference signal and outputs a configuration data according to the phase difference between the input signal and the reference signal.

20 Claims, 6 Drawing Sheets

US 7,579,863 B2

CIRCUIT AND METHOD FOR REDUCING PIN COUNT OF CHIP

This application claims the benefit of Taiwan application serial no. 096104191, filed on Feb. 6, 2007, the subject matter of which is incorporated herein by reference.

FIELD OF INVENTION

The present invention relates to an electric circuit, and particularly to a configured circuit and the method thereof.

BACKGROUND

Generally, each integrated circuit (IC) provides multiple operational modes. The operational mode of an IC is usually configured at the power on or reset, so as to ensure the IC could start operating with the correct operational mode. Normally during initialization, the initial state of the IC is determined by providing working voltage or ground voltage to a plurality of specific pins of the IC. Thus, when the operational modes provided by the IC are increased, the number of pins of the IC will also be increased in response to the configuration of operational modes. For the IC design, the more pins the IC has, the larger volume the IC has, relatively. Therefore, how to reduce the pin numbers required by the initialization of IC is still a target each engineer is aggressively developing on. The related techniques and research could be referred to U.S. Pat. No. 6,831,479 and Taiwan Patent publication No. 200633381.

SUMMARY

One of the objects of the present invention is to provide a configured circuit and method thereof, so as to solve those limitations and disadvantages existed in the prior art.

One of the objects of the present invention is to provide a configured circuit and method thereof, so as to reduce the pin numbers required in configuration.

The terminals are utilized to receive an input clock signal. A decision circuit is utilized to receive a reference clock signal and the input clock signal, and to output a configuration signal by detecting the phase difference between the reference clock signal and the input clock signal. The decision circuit includes a phase detector and a determining circuit. The phase detector is utilized to detect the phase difference between the reference clock signal and the input clock signal so as to generate a phase difference signal, and the determining circuit generates a configuration data according to the phase difference signal. Therefore, the determining circuit could be a counter, which counts the pulse width of the phase difference signals to generate the configuration data in accordance with the clock signal.

Herein, the configuration data generated by the configured setting circuit includes the configuration data generated by the whole decision circuits.

The decision circuit may be configured with an integrated circuit (IC), and the terminals could be the pins or bonding pads of the IC.

Herein, the input signal could be one of multiple clock signals with different frequencies.

Moreover, it could employ a multiple-phase clock generating circuit to generate multiple clock signals with different phases, and output these clock signals through other terminals. The multiple-phase clock generating circuit could also be configured within the IC, configured outside the IC. Furthermore, the terminal utilized to output the clock signals may be the pins or bonding pads of the IC, or be the output terminal of the multiple-phase clock generating circuit.

The multiple-phase clock generating circuit includes a multiple-phase clock generator and a phase interpolation circuit. Herein, the multiple-phase clock generator will generate a plurality of clock signals, and the phase interpolation circuit will generate multiple clock signals with different phases based on the reference clock signals.

Moreover, under the initial configuration (i.e. the configuration mode) and the normal operation (i.e. the working mode) of the IC, it could share the terminals for signal transmission; wherein, the selection circuit, such as a switch module or a multiplexer, could be coupled between the multiple phase clock generator or the phase detector, so as to control the operation of terminals based on the working mode; and, designing a controller to generate a control signal for controlling the operation of the switch module or the multiplexer.

The features and embodiments related to the present invention will be described in details with the figures as the preferred embodiments as follows.

DETAILED DESCRIPTION

The following will list the embodiments for describing the contents of the present invention in details, and employs the figures as auxiliary description. The symbols referred in the description are the referral figure numbers.

Figure 1:
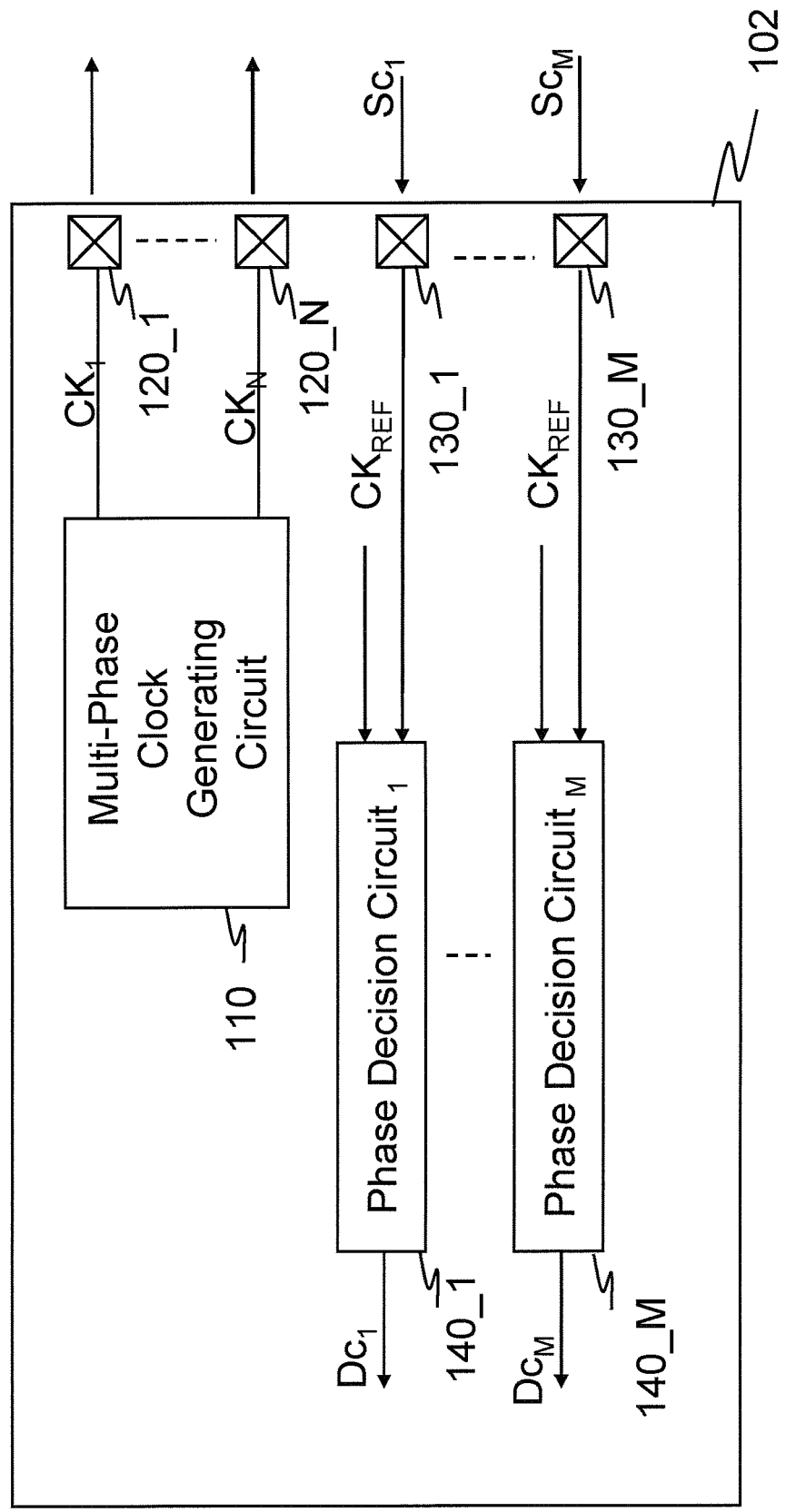
FIG. 1 is a block diagram for a configured setting circuit of a first embodiment according to the present invention.

Referring to FIG. 1, the figure is a configured setting circuit according to the present invention, which is utilized to generate the configuration data $Dc_1 \sim Dc_M$ required for setting the configuration of an IC, including a multiple-phase clock generating circuit 110, a plurality of terminals 120_1~120_N, 130_1~130_M, such as bonding pads, circuit nodes, and the like, and at least one decision circuits 140_1~140_M, in which N, M are positive integers.

The multiple-phase clock generating circuit 110 is utilized to generate multiple phase clock signals $CK_1 \sim CK_N$; in which, the clock signals $CK_1 \sim CK_N$ could have different phases. The multiple-phase clock generating circuit 110 is coupled to a plurality of terminals, 120_1~120_N, and the signal terminals 120_1~120_N will output a clock signal, respectively, (i.e. one of the output clock signals 120_1~120_N).

The decision circuits 140_1~140_M are coupled to one terminal 130_1~130_M, respectively. The terminals 130_1~130_M receive one input signal $Sc_1 \sim Sc_M$, respectively; and, the decision circuits 140_1~140_M detect the input signal $Sc_1 \sim Sc_M$, and output the configuration data $Dc_1 \sim Dc_M$. In other words, the first decision circuit 140_1 detects the first input signal $Sc_1$ received at the first terminal 130_1, and generates the first configuration data $Dc_1$ accordingly; the second decision circuit 140_2 detects the second input signal $Sc_2$ received at the second terminal 130_2, and generates the second configuration data $Dc_2$ accordingly; similarly, the $M^{th}$ decision circuit 140_M detects the $M^{th}$ input signal $Sc_M$ received at the $M^{th}$ terminal 130_M, and generates the $M^{th}$ configuration data $Dc_M$ accordingly.

Herein, the decision circuit 140_1~140_M will output the configuration data $Dc_1$~$Dc_M$ by detecting the phase difference of the input signals $Sc_1$~$Sc_M$ and the reference signal $CK_{REF}$. That is, the configuration data $Dc_M$ outputted by the decision circuit 140_M is corresponding to the phase difference between the received input signal $Sc_M$ and the reference signal $CK_{REF}$.

In an embodiment, each input signal $Sc_M$ may be one of the clock signals $CK_N$, in which N is an integer four, and the configuration data $Dc_1$ may be two bits configuration data; and, in another embodiment, each input signal $Sc_M$ may be one of the eight clock signals with different phases respectively, and the configuration data $Dc_1$ may be three-bit configuration data.

Moreover, if two decision circuits are configured, the first decision circuit 130_1 and the second decision circuit 130_2 will output the first and the second configuration data $Dc_1$, $Dc_2$ in two bits according to the first input signal $Sc_1$ and the second input signal $Sc_2$ received at the first terminal 130_1 and the second terminal 130_2, respectively, so the total configuration data outputted by the configured setting circuit will be a four-bit data. Practically, based on the requirement for the circuit, the input signal $Sc_M$ could be designed as one of $2^K$ different signals and with M numbers of decision circuits, and the total configuration data will be K×M bits.

Figure 2:
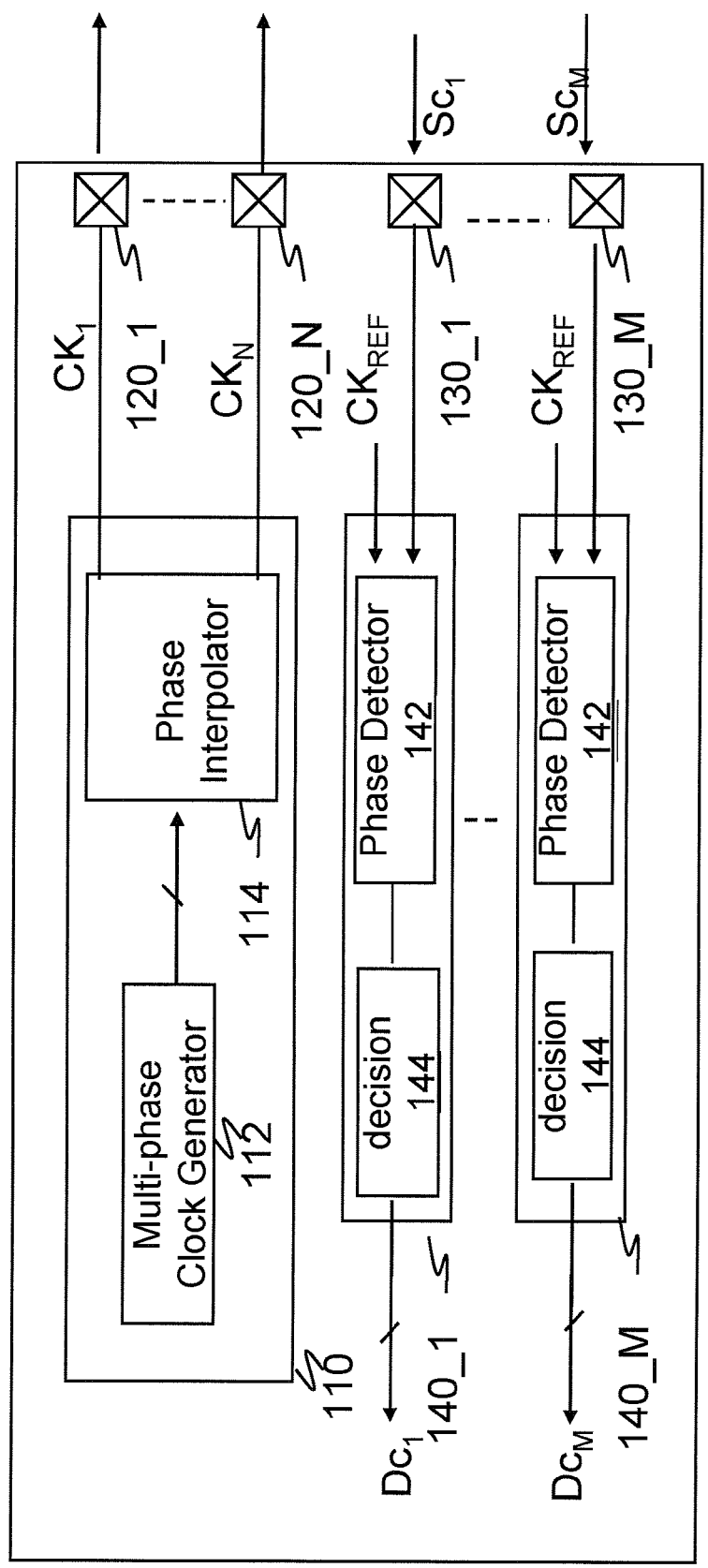
FIG. 2 is a block diagram for a configured setting circuit of a second embodiment according to the present invention.

Refer to FIG. 2, in an embodiment, the decision circuit 140 may includes a phase detector 142 and a decision circuit 144. The phase detector 142 is utilized to compare the phase difference between the two input signals, and outputs a phase difference signal according to the phase difference. The decision circuit 144 outputs the configuration data $Dc_M$ according to the phase difference signal generated by the phase detector 142. Herein, the decision circuit 144 may be a counter or a timer, which is utilized to figure the pulse width of the phase difference signal and output the configuration data $Dc_M$ according to the pulse width of the phase difference signal. Moreover, in an embodiment, the multiple-phase clock generating circuit 110 is a phase lock loop (PLL) or a delay lock loop (DLL). And, in another embodiment, the multiple-phase clock generating circuit 110 may includes a clock generator 112 and a phase interpolation circuit 114. The clock generator 112 may be a PLL or a DLL.

In an embodiment, under the configuration mode and the working mode for the IC, the configured setting circuit according to the present invention could share the terminals 120_1~120_N and/or 130_1~130_M for signal transmission, as shown in FIGS. 3A, 3B, 4, and 5. Herein, a selection circuit, such as a switch module 160, 180 or a multiplexer 170, could be utilized to control the operation of terminals 120_1~120_N and/or 130_1~130_M according to the working mode.

Figure 3A:
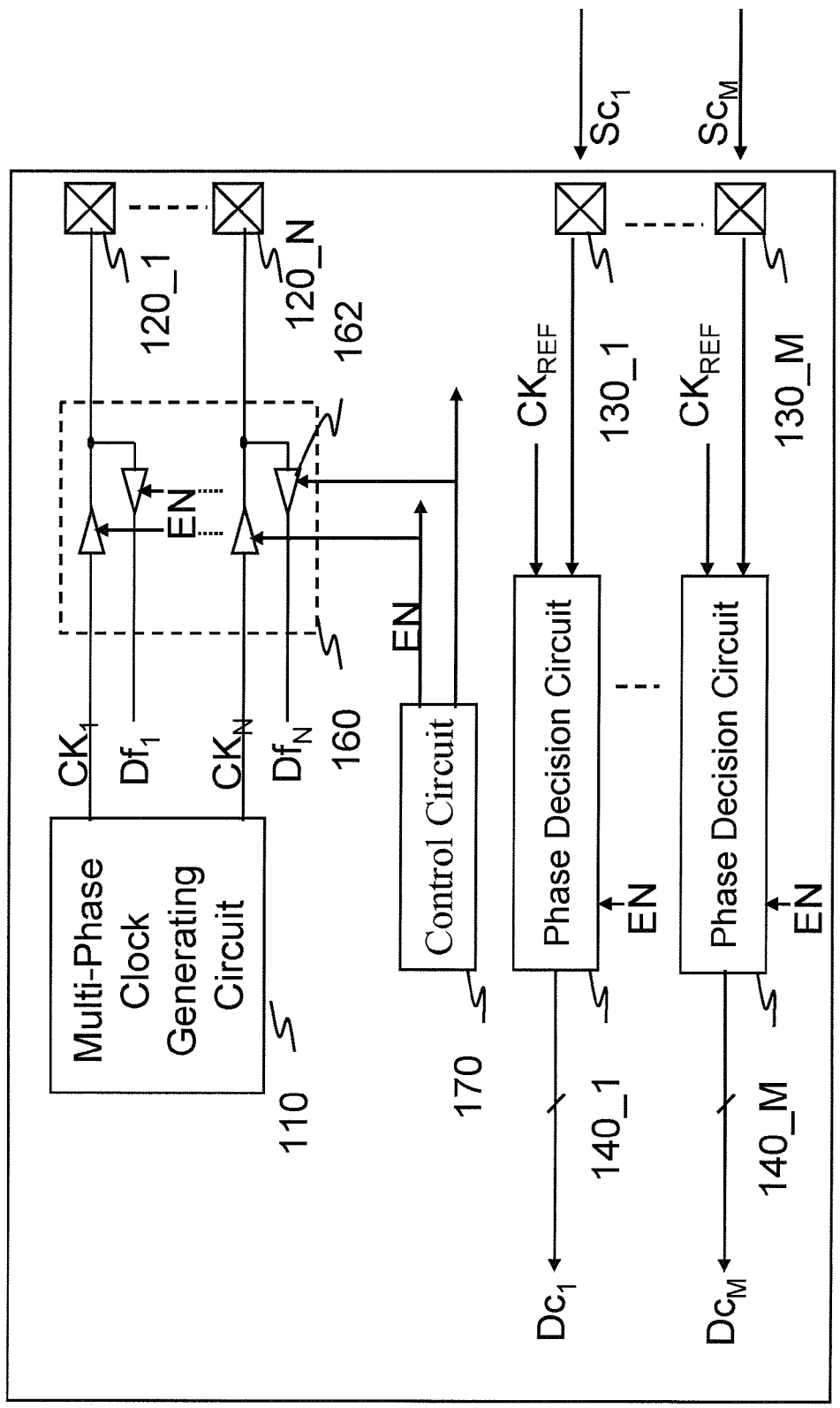
FIG. 3A and FIG. 3B is an operation diagram for a decision circuit in an embodiment according to the present invention.
Figure 3B:
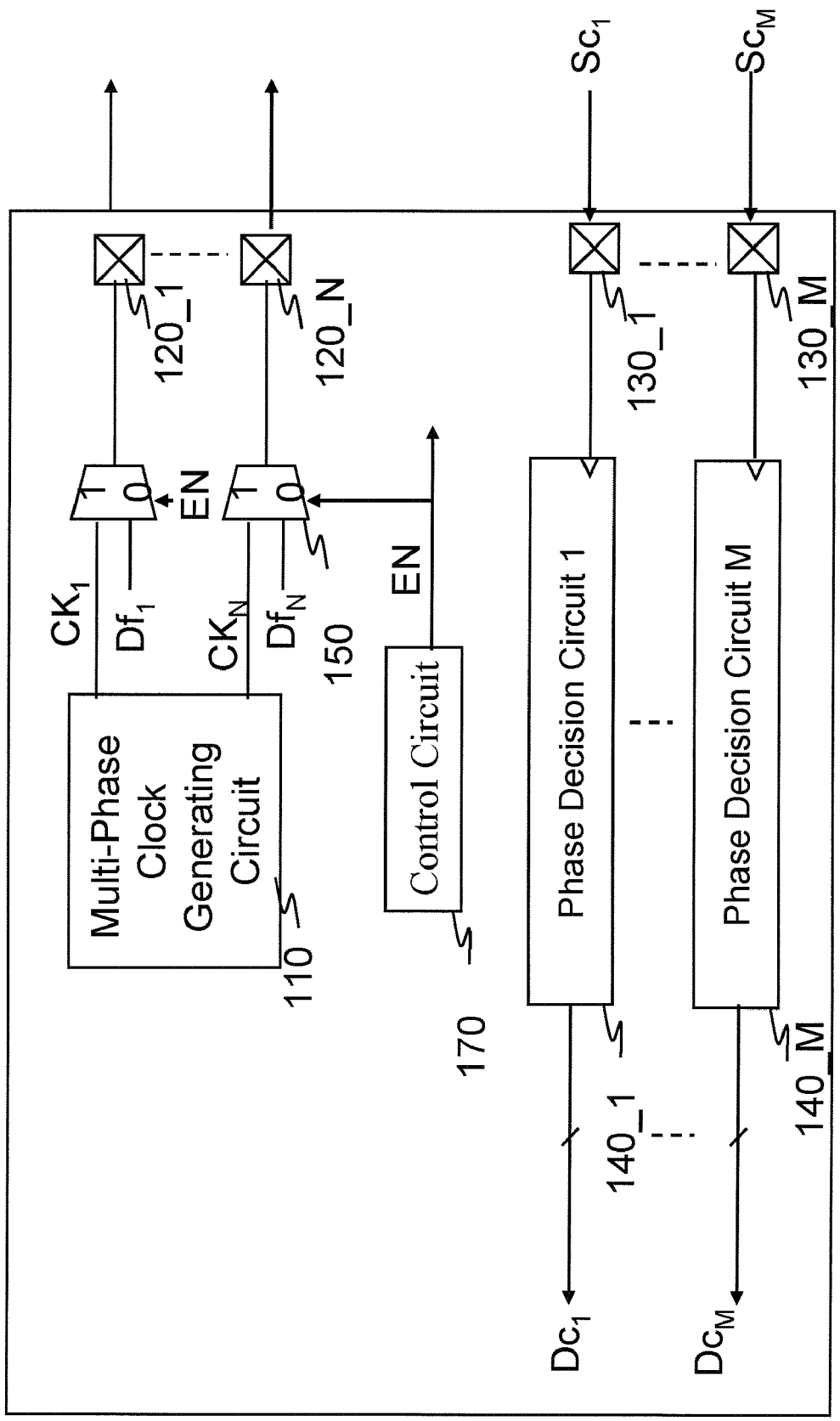

Refer to FIG. 3A, the switch module 160 is coupled between the multiple-phase clock generating circuit 110 and the terminals 120_1~120_N; when the IC is proceeding with the initialization setup, i.e. under configuration mode and start-up, the switch module 160 will connect up the multiple-phase clock generating circuit 110 and the terminals 120_1~120_N, so the clock signals $CK_1$~$CK_N$ generated by the multiple-phase clock generator 110 will be outputted through the terminals 120_1~120_N; and, when the IC is proceeding with normal operation, i.e. under working mode, the switch module 160 will connect up the associated operation circuit (not shown) with the terminals 120_1~120_N, so the delivery signals $Df_1$~$Df_N$ will be transmitted through the terminals 120_1~120_N. Similarly, referring to FIG. 3B, the operation principle for the multiplexer 150 is the same as the switch module 160 in FIG. 3A.

Figure 4:
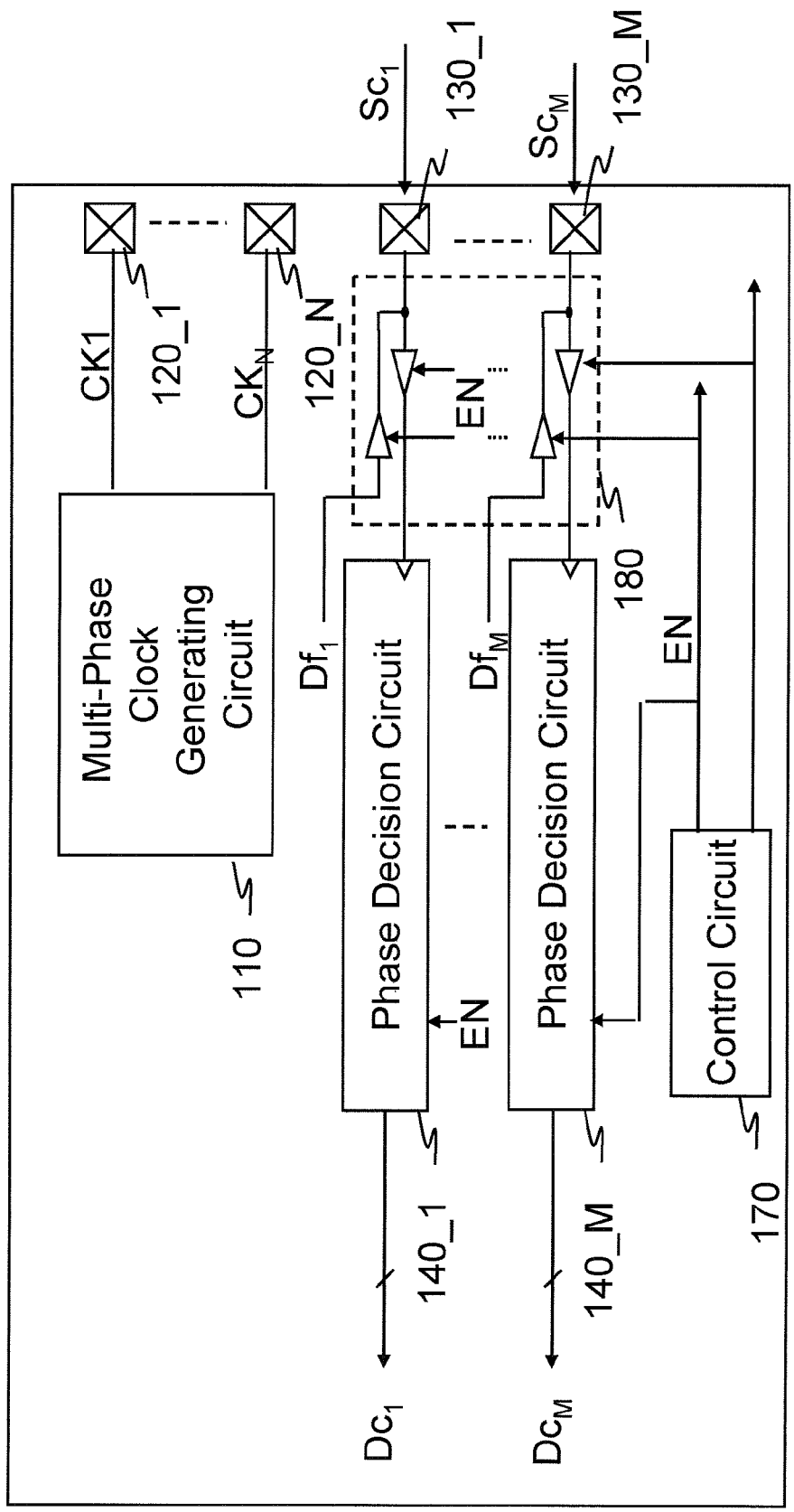
FIG. 4 is a block diagram for a configured setting circuit of a third embodiment according to the present invention.

Refer to FIG. 4, a selection circuit 180 may be coupled between the decision circuit 140_1~140_M and the terminals 130_1~130_M; when the IC is under configuration mode, the selection circuit 180 will connect up the decision circuit 140_1~140_M and the terminals 130_1~130_M, so the input signal $Sc_M$ will be outputted to the decision circuit 140_M; when the IC is under working mode, the selection circuit 180 will connect up the associated operation circuits (not shown) and the terminals 130_1~130_M, so the delivery signals $Df_1$~$Df_M$ will be transmitted through the terminals 130_1~130_M.

Refer to FIGS. 3A, 3B, 4, and 5 again, a control circuit 170 could be utilized to generate a control signal EN to control the operation of the selection circuit, such as the switch module 160, 180, and multiplexier 150, and the decision circuit 140.

Certainly, under the working mode, the terminals 120_1~120_N/130_1~130_M may be the input terminals of another circuit or the output terminals of another circuit or the I/O terminals of another circuit. With the shared terminals 120_1~120_N/130_1~130_M, or both, it could achieve the purpose for saving pins.

Figure 5:
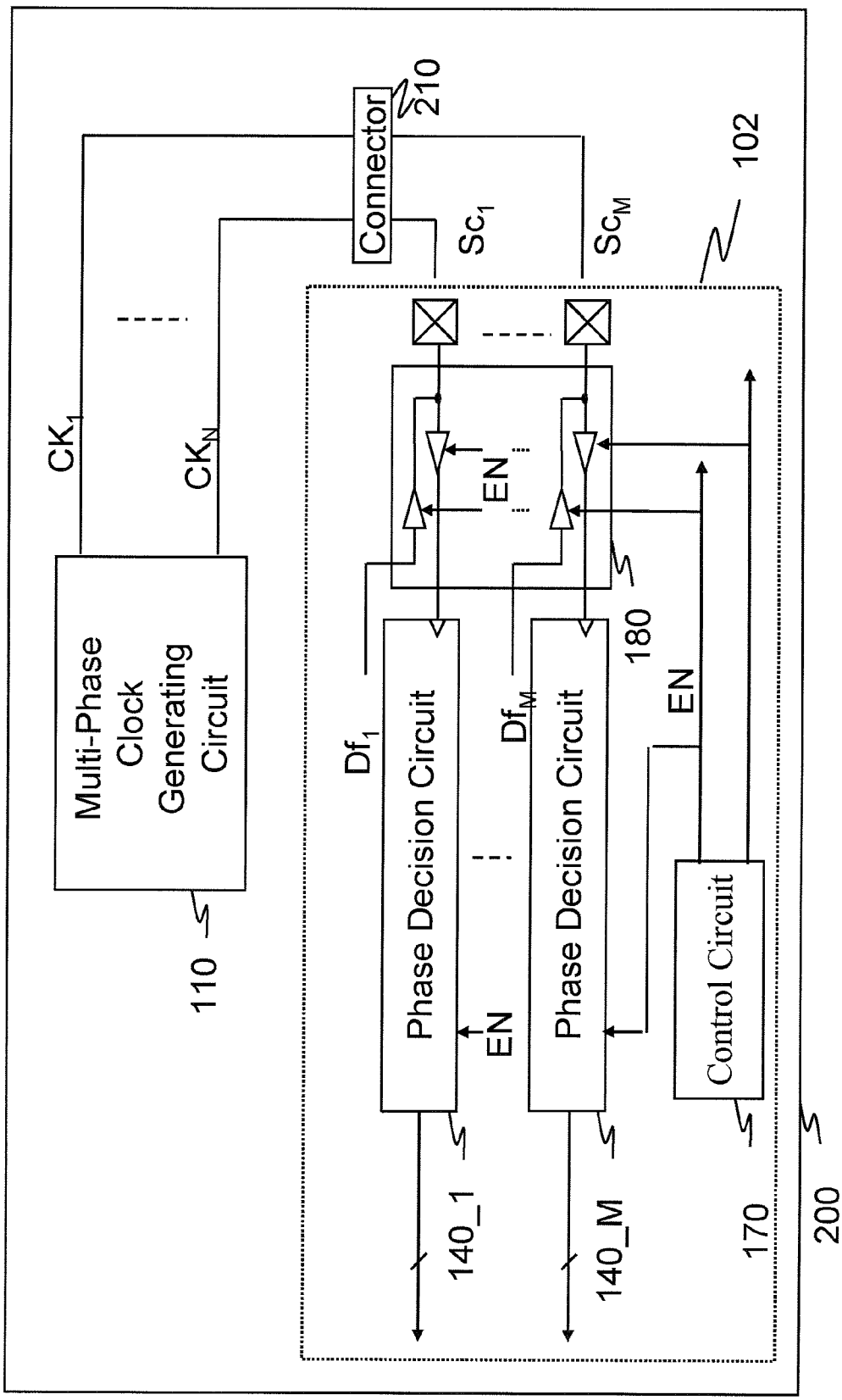
FIG. 5 is a block diagram for a configured setting circuit of a fourth embodiment according to the present invention.

In an embodiment, the multiple-phase generating circuit 110 and the decision circuit 140 could be configured within the IC 102, and the terminals 120_1~120_N/130_1~130_M may be the pins or bonding pads of the IC 102, as shown in FIG. 5. In another embodiment, the decision circuit 140 is configured outside the IC 102. That is, the IC 102 and the multiple-phase clock generating circuit 110 could be installed on a board 200, as shown in FIG. 5; in the mean time, the terminals 120_1~120_N may be the output terminals of the multiple-phase clock generating circuit 110, and the terminals 130_1~130_M may be the pins or bonding pads of the IC 102, and employs a connector 104 to make the input signal $Sc_M$ being one of the clock signals $CK_1$~$CK_N$. The connector 104 may be such a device that it can change the connecting configuration, such as a DIP switch and a jumper. The configuration method according to the present invention has the features similar to the configuration circuit according to the present invention, which will not be described herein.

The application of the present invention could be implemented on circuits operated at several different frequencies easily. As the frequency of the multiple-phase clock signal outputted by the multiple-phase clock generating circuit 110 is lower, the duration of the phase difference of adjacent clock signals is larger. That is, the decision 140 may be simpler, i.e. the phase detector 142 and the decision circuit 144 may not be precise for design if they can process the duration of the phase difference of adjacent clock signals well. The present invention generates the corresponding configuration data by detecting the amount of the phase difference, particularly to the circuits operated at high frequency. For the above-mentioned reasons, the decision circuit 140 may be a simple circuit for design.

The technical contents of the present invention have been disclosed with preferred embodiments as above. However, the disclosed embodiments are not used to limit the present invention. The skilled in the art could make slight changes and modification without departing from the spirit and scope of the present invention, and the changes and modification made thereto are all covered by the scope of the present invention. The protection scope for the present invention should be defined with the attached claims.

What is claimed is:

1. A circuit for producing a configuration data, comprising:
   a multiple-phase clock generating circuit utilized to generate a plurality of clock signals, wherein phases of the plurality of clock signals are substantially different;
   a plurality of first terminals utilized to output the plurality of clock signals;
   a second terminal utilized to receive a first input signal, in which the first input signal is substantially one of the plurality of clock signals; and
   a first decision circuit, coupled to the first terminal, utilized to receive a reference signal, detect a phase difference between the reference signal and the first input signal, and generate a first configuration data of the configuration data according to the phase difference between the reference signal and the first input signal.

2. The circuit of claim 1, further comprising:
   a third terminal utilized to receive a second input signal, wherein the second input signal is substantially one of the plurality of clock signals; and
   a second decision circuit, coupled to the third terminal, utilized to receive the reference signal, detect a phase difference between the reference signal and the second input signal, and generate a second configuration data of the configuration data according to the phase difference between the reference signal and the second input signal.

3. The circuit of claim 1, wherein the first decision circuit comprises:
   a phase detector utilized to detect the phase difference between the reference signal and the first input signal to generate a first phase difference signal; and
   a decision circuit utilized to generate the first configuration data based on the first phase difference signal.

4. The circuit of claim 1, wherein the multiple-phase clock generating circuit further comprises:
   a multiple-phase clock generator for generating a plurality of multiple-phase clock signals; and
   a phase interpolation circuit, coupled to the multiple-phase clock generator, for generating the plurality of clock signals based on the interpolation operation of the multiple phase clock signals.

5. The circuit of claim 1, wherein at least one of the first terminals transfers one of the clock signals or transfers a transferred signal based on a control signal.

6. The circuit of claim 1, wherein the second terminal receives the first input signal or transfers a transferred signal based on a control signal.

7. The circuit of claim 1, further comprising:
   a selection circuit coupled between the first terminal and the multiple-phase clock generating circuit; and
   a control circuit, coupled to the selection circuit, for controlling the operation of the selection circuit.

8. The circuit of claim 1, wherein the first configuration data is at least two-bit configuration data.

9. The circuit of claim 8, wherein the plurality of clock signals comprise at least four clock signals with different phase.

10. The circuit of claim 1, further comprising:
    a connection unit coupled between the second terminal and one of the first terminals.

11. A circuit for producing a configuration data, comprising:
    a first terminal utilized to receive a first input signal, wherein the first input clock is one of a plurality of input signals with different phase; and
    a first decision circuit, coupled to the first terminal, utilized to receive a reference signal, detect a phase difference between the reference signal and the first input signal, and produce a first configuration signal of the configuration signal according to the phase difference between the reference signal and the first input signal.

12. The circuit of claim 11, further comprising:
    a second terminal utilized to receive a second input signal, wherein the first input clock is one of a plurality of input signals with different phase; and
    a second decision circuit, coupled to the second terminal, utilized to receive the reference signal, detect a phase difference between the reference signal and the second input signal, and produce a second configuration signal of the configuration signal according to the phase difference between the reference signal and the second input signal.

13. The circuit of claim 11, wherein the first decision circuit comprises:
    a phase detector utilized to detect the phase difference between the reference signal and the first input signal, and generate a phase difference signal; and
    a decision circuit utilized to generate the first configuration data based on the phase difference signal.

14. The circuit of claim 11, further comprising:
    a selection circuit coupled between the first terminal and the first decision circuit for selectively transferring the first input signal and a transferred signal; and
    a control circuit, coupled to the selection circuit, for controlling the operation of the selection circuit.

15. The circuit of claim 11, wherein the first configuration data is at least two-bit configuration data.

16. The circuit of claim 15, wherein the first input signal is one of at least four clock signals with different phase.

17. A method, comprising:
    providing a reference signal;
    utilizing a first terminal to receive a first input signal, wherein the first input clock is one of a plurality of clock signals with different phase;
    detecting a phase difference between the reference signal and the first input signal to output a first phase difference signal; and
    determining a first configuration signal according to the first phase difference signal.

18. The method of claim 17, wherein the first configuration signal is determined by counting the first phase difference signal.

19. The method of claim 17, further comprising:
    utilizing a second terminal to receive a second input signal, wherein the first input clock is one of a plurality of clock signals with different phase; and
    detecting a phase difference between the reference signal and the second input signal to output a second phase difference signal;
    determining a second configuration signal according to the second phase difference signal; and
    combining the first configuration data and the second configuration data to produce a configuration signal.

20. The method of claim 19, wherein the first configuration data and the second configuration data are at least two-bit configuration data.

* * * * *